US011315771B2

(12) United States Patent
Xie et al.

(10) Patent No.: US 11,315,771 B2
(45) Date of Patent: Apr. 26, 2022

(54) METHODS AND APPARATUS FOR PROCESSING A SUBSTRATE

(71) Applicant: APPLIED MATERIALS, INC., Santa Clara, CA (US)

(72) Inventors: Xiangjin Xie, Fremont, CA (US); Fuhong Zhang, San Jose, CA (US); Shirish A. Pethe, Cupertino, CA (US); Martin Lee Riker, Milpitas, CA (US); Lewis Yuan Tse Lo, Saratoga, CA (US); Lanlan Zhong, Santa Clara, CA (US); Xianmin Tang, San Jose, CA (US); Paul Dennis Connors, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 5 days.

(21) Appl. No.: 16/928,606

(22) Filed: Jul. 14, 2020

(65) Prior Publication Data

US 2022/0020578 A1    Jan. 20, 2022

(51) Int. Cl.
| | |
|---|---|
| H01J 37/34 | (2006.01) |
| C23C 14/34 | (2006.01) |
| H01J 37/32 | (2006.01) |
| C23C 14/14 | (2006.01) |
| C23C 14/54 | (2006.01) |

(52) U.S. Cl.
CPC ......... *H01J 37/3476* (2013.01); *C23C 14/14* (2013.01); *C23C 14/34* (2013.01); *C23C 14/54* (2013.01); *H01J 37/32816* (2013.01); *H01J 37/3426* (2013.01)

(58) Field of Classification Search
CPC ............ H01J 37/3476; H01J 37/32816; H01J 37/3426; C23C 14/14; C23C 14/34; C23C 14/54
See application file for complete search history.

(56) References Cited

U.S. PATENT DOCUMENTS

| | | | | | |
|---|---|---|---|---|---|
| 5,407,863 | A | * | 4/1995 | Katsura | ............... H01L 21/2855 |
| | | | | | 257/E21.169 |
| 5,830,330 | A | * | 11/1998 | Lantsman | ............. H01J 37/321 |
| | | | | | 204/192.12 |
| 5,993,165 | A | | 11/1999 | Lorimer et al. | |

(Continued)

OTHER PUBLICATIONS

International Search Report for PCT/US2021/041211, dated Oct. 28, 2021.

*Primary Examiner* — Jennifer Wecker
*Assistant Examiner* — Patrick S Ott
(74) *Attorney, Agent, or Firm* — Moser Taboada

(57) ABSTRACT

Methods and apparatus for processing a substrate are provided herein. A method, for example, includes igniting a plasma at a first pressure within a processing volume of a process chamber; depositing sputter material from a target disposed within the processing volume while decreasing the first pressure to a second pressure within a first time frame while maintaining the plasma; continuing to deposit sputter material from the target while decreasing the second pressure to a third pressure within a second time frame less than the first time frame while maintaining the plasma; and continuing to deposit sputter material from the target while maintaining the third pressure for a third time frame that is greater than or equal to the second time frame while maintaining the plasma.

5 Claims, 2 Drawing Sheets

(56) References Cited

U.S. PATENT DOCUMENTS

| | | | |
|---|---|---|---|
| 6,077,779 | A | 6/2000 | Shue et al. |
| 6,117,279 | A | 9/2000 | Smolanoff et al. |
| 6,449,525 | B1 | 9/2002 | Liu et al. |
| 6,458,251 | B1 | 10/2002 | Sundarrajan et al. |
| 6,709,553 | B2 | 3/2004 | Wang et al. |
| 6,790,323 | B2 | 9/2004 | Fu et al. |
| 7,905,991 | B2 | 3/2011 | Esselbach et al. |
| 2003/0199156 | A1* | 10/2003 | Fujii ................. H01L 21/76897 438/597 |
| 2005/0255691 | A1 | 11/2005 | Ding et al. |
| 2010/0252417 | A1 | 10/2010 | Allen et al. |
| 2011/0209982 | A1* | 9/2011 | Yu ......................... C23C 14/185 204/192.1 |
| 2012/0028461 | A1* | 2/2012 | Ritchie ................. C23C 14/345 438/653 |
| 2015/0064920 | A1* | 3/2015 | Dhindsa ............ H01J 37/32816 438/714 |

* cited by examiner

METHODS AND APPARATUS FOR PROCESSING A SUBSTRATE

FIELD

Embodiments of the present disclosure generally relate to methods and apparatus for processing a substrate, and more particularly, to methods and apparatus configured for metal deposition on a substrate.

BACKGROUND

Deposition chambers configured for substrate (e.g., chip) fabrication are known. During substrate fabrication, one or more features (e.g., trenches, vias and other like structures) can be formed on the substrate. As trenches and vias structures formed on the substrates are getting smaller, metal deposition interconnect processes and/or gap fill solutions are becoming increasingly more challenging to overcome. To overcome such challenges, conventional methods and apparatus use a relatively short metal deposition time to reduce an amount of metal deposition (e.g., before pinch-off) on a substrate. The inventors have observed that, at a beginning of that relatively short metal deposition time, neutrals are not desired due to scattering which will create overhang at the entrance of a structure. To ensure adequate metal deposition coverage on the substrate (e.g., over trenches and structures), more ions or high ionization ratios are required which will facilitate a more directional deposition, and thus better bottom coverage within the structure.

SUMMARY

Methods and apparatus for processing a substrate are provided herein. In some embodiments, a method for processing a substrate includes igniting a plasma at a first pressure within a processing volume of a process chamber; depositing sputter material from a target disposed within the processing volume while decreasing the first pressure to a second pressure within a first time frame while maintaining the plasma; continuing to deposit sputter material from the target while decreasing the second pressure to a third pressure within a second time frame less than the first time frame while maintaining the plasma; and continuing to deposit sputter material from the target while maintaining the third pressure for a third time frame that is greater than or equal to the second time frame while maintaining the plasma.

In at least some embodiments, a non-transitory computer readable storage medium having stored thereon instructions that, when executed by a processor, cause a method for processing a substrate to be performed. The method includes igniting a plasma at a first pressure within a processing volume of a process chamber; depositing sputter material from a target disposed within the processing volume while decreasing the first pressure to a second pressure within a first time frame while maintaining the plasma; continuing to deposit sputter material from the target while decreasing the second pressure to a third pressure within a second time frame less than the first time frame while maintaining the plasma; and continuing to deposit sputter material from the target while maintaining the third pressure for a third time frame that is greater than or equal to the second time frame while maintaining the plasma.

In at least some embodiments, a processing chamber for processing a substrate includes a gas inlet configured to receive a process gas from a gas source; a power source configured to supply power to a target disposed within a process volume of the processing chamber; a pump configured to remove the process gas from the process volume; and a controller configured to: ignite a plasma at a first pressure within the processing volume of the process chamber; deposit sputter material from the target disposed within the processing volume while decreasing the first pressure to a second pressure within a first time frame while maintaining the plasma; continue to deposit sputter material from the target while decreasing the second pressure to a third pressure within a second time frame less than the first time frame while maintaining the plasma; and continue to deposit sputter material from the target while maintaining the third pressure for a third time frame that is greater than or equal to the second time frame while maintaining the plasma.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
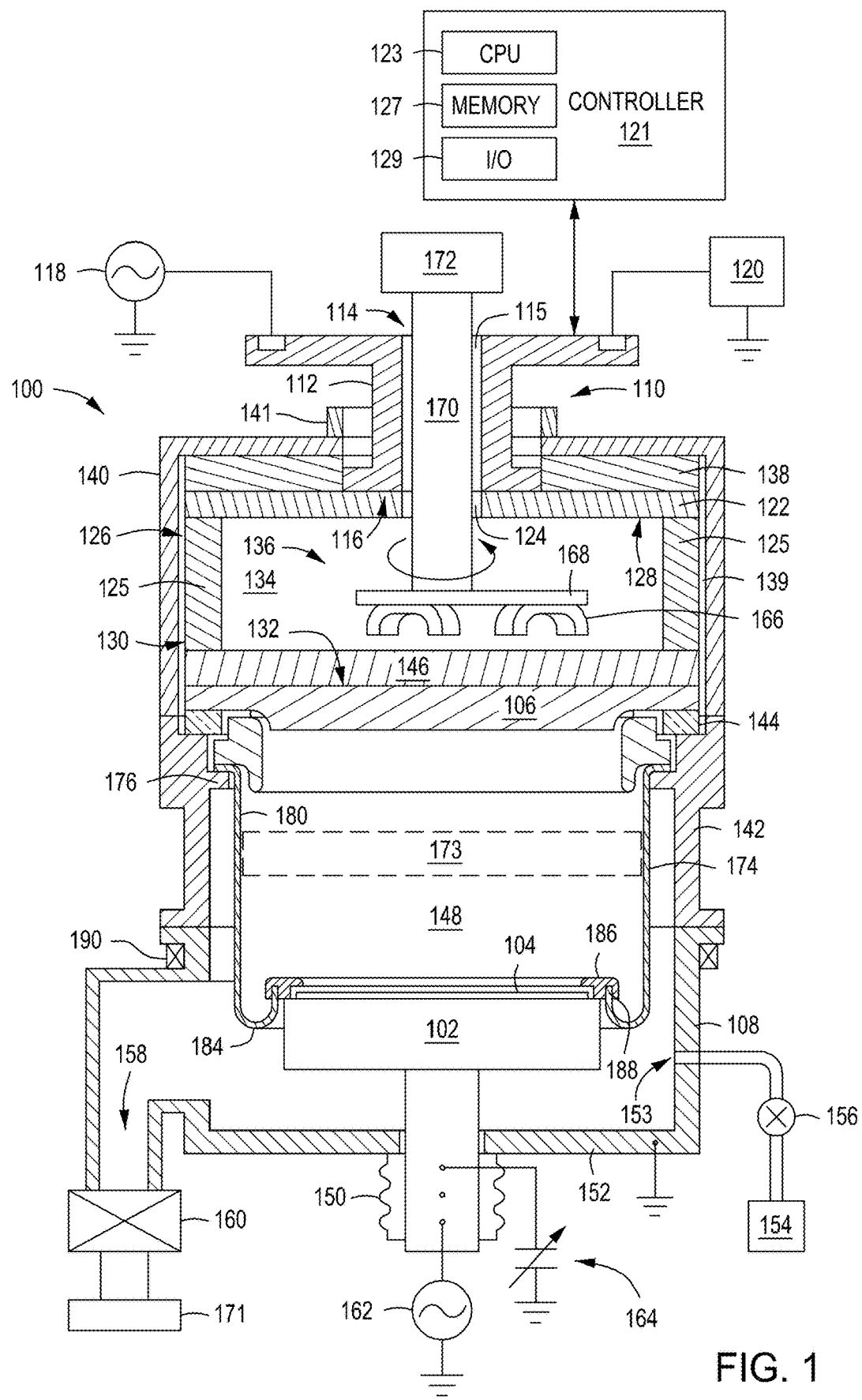
FIG. 1 is a schematic cross-sectional view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, a method for processing (e.g., metal deposition) a substrate described herein includes using one or more pumps to quickly reduce a pressure within a processing chamber to a low steady state pressure. In doing so, neutrals and scattering is significantly reduced, and ionization ratio is increased, thus resulting in improved metal deposition coverage on a substrate (e.g., in the trenches and vias).

FIG. 1 is a schematic cross-sectional view of a processing chamber 100 in accordance with at least some embodiments of the present disclosure. The processing chamber 100 can be one or more deposition chambers such as a physical vapor deposition chamber (PVD), a chemical vapor deposition chamber (CVD), an atomic layer deposition chamber (ALD), or other type of deposition chamber. In the illustrated embodiment, for example, the processing chamber 100 is PVD processing chamber. Examples of suitable PVD chambers include the ALPS® Plus, SIP ENCORE®, ENCORE 3®, ACCESS® 2, and ACCESS® 3 PVD processing chambers all commercially available from Applied Materials, Inc., of Santa Clara, Calif. Other processing chambers from Applied Materials, Inc. or other manufacturers may also benefit from the inventive methods and apparatus disclosed herein.

The processing chamber 100 (e.g., plasma chamber) contains a substrate support pedestal 102 for receiving a substrate 104 thereon, and a sputtering source, such as a target 106. The substrate support pedestal 102 may be located within a chamber wall 108 (e.g., a grounded aluminum chamber wall), which may be a chamber wall (as shown) or a grounded shield. A ground shield 140 is shown covering at least some portions of the processing chamber 100 above the target 106 in FIG. 1. In some embodiments, the ground shield 140 could be extended below the target to enclose the pedestal 102 as well.

The processing chamber includes a feed structure 110 for coupling RF and DC energy to the target 106. The feed structure is an apparatus for coupling RF energy, and optionally DC energy, to the target, or to an assembly containing the target, for example, as described herein. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and, optionally, a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120. Optionally, the DC power source 120 may be alternatively coupled to the target without going through the feed structure 110 (as shown in phantom in FIG. 1).

The feed structure 110 may have a suitable length that facilitates substantially uniform distribution of the respective RF and DC energy about the perimeter of the feed structure 110. For example, in some embodiments, the feed structure 110 may have a length of about 0.75 to about 12 inches, or about 3.26 inches. In some embodiments, where the body 112 does not have a central opening, the feed structure 110 may have a length of about 0.5 to about 12 inches.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water ($H_2O$) or the like.

The ground shield 140 may be provided to cover the outside surfaces of the lid of the process chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar 141 may be disposed about body 112 and lower portion of the feed structure 110. The ground collar 141 is coupled to the ground shield 140 and may be an integral part of the ground shield 140 or a separate part coupled to the ground shield to provide grounding of the feed structure 110. The ground collar 141 may be made from a suitable conductive material, such as aluminum or copper. In some embodiments, a gap disposed between the inner diameter of the ground collar 141 and the outer diameter of the body 112 of the feed structure 110 may be kept to a minimum and be just enough to provide electrical isolation. The gap can be filled with isolating material like plastic or ceramic or can be an air gap. The ground collar 141 prevents cross-talk between the RF feed and the body 112, thereby improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure 110 to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

The target 106 may be supported on an adapter 142 (e.g., a grounded conductive aluminum adapter) through a dielectric isolator 144. The target 106 comprises a material to be deposited on the substrate 104 during sputtering, such a metal or metal oxide. For example, in at least some embodiments, the target 106 can be made from at least one of cobalt, copper, manganese, tantalum, titanium, tungsten, or alloys thereof.

The backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

In at least some embodiments, a collimator 173 (e.g., a biasable collimator shown in phantom) can be provided between the target 106 and the substrate 104 to facilitate directing sputter material to a target facing surface of the substrate 104. The collimator 173 is a physical structure such as a shroud, disk, a plurality of baffles, or the like, having one or more openings through which the sputter material can pass to reach the substrate 104.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a process volume 148 of the processing chamber 100. The process volume 148 is defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of processing the processing chamber 100 and thereafter raised to a deposition, or processing position. One or more process gases may be supplied from a gas source 154 through a mass flow controller 156 into the lower part of the processing chamber 100 via a gas inlet 153. For example, in at least some embodiments, the process gas can be one or more noble gases such as argon (Ar), helium (He), krypton (Kr), neon (Ne), radon (Rn), xenon (Xe), or can be one or more other non-reactive gases. For example, in at least some embodiments, the process gas can be Ar.

An exhaust port 158 may be provided and coupled to one or more suitable pumps 171 via a valve 160 for exhausting the interior of the processing chamber 100 of process gas and facilitating maintaining a desired pressure inside the processing chamber 100. For example, in at least some embodiments, the pump 171 can be a cryogenic pump, such as sputter pump. The pump 171 can have a heat sink plate with through holes (not shown). The pump 171 is sized to maintain an optimal pressure throughout a processing sequence. In at least some embodiments the pump 171 can include cryogenic pumps with relatively high pumping capacity to reduce the operating chamber pressure and the transient chamber pressure during gas flow events.

An RF bias power source 162 may be coupled to the substrate support pedestal 102 to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the processing chamber 100 and the substrate 104. A motor 172 can be coupled to the upper end of the rotation shaft 170 to drive rotation of the rotatable magnetron assembly 136. The magnets 166 produce a magnetic field within the processing chamber 100, generally parallel and close to the surface of the target 106 to trap electrons and increase the local plasma density, which in turn increases the sputtering rate. The magnets 166 produce an electromagnetic field around the top of the processing chamber 100, and magnets 166 are rotated to rotate the electromagnetic field which influences the plasma density of the process to more uniformly sputter the target 106. For example, the rotation shaft 170 may make about 0 to about 150 rotations per minute.

In some embodiments, the processing chamber 100 may further include a grounded bottom shield 174 connected to a ledge 176 of the adapter 142. A dark space shield 178 may be supported on the bottom shield 174 and may be fastened to the bottom shield 174 by screws or other suitable manner. The metallic threaded connection between the bottom shield 174 and the dark space shield 178 allows the bottom shield 174 and the dark space shield 178 to be grounded to the adapter 142. The adapter 142 in turn is sealed and grounded to the chamber wall 108. Both the bottom shield 174 and the dark space shield 178 are typically formed from hard, non-magnetic stainless steel.

The bottom shield 174 extends downwardly and may include a generally tubular portion 180 having a generally constant diameter. The bottom shield 174 extends along the walls of the adapter 142 and the chamber wall 108 downwardly to below a top surface of the substrate support pedestal 102 and returns upwardly until reaching a top surface of the substrate support pedestal 102 (e.g., forming a u-shaped portion 184 at the bottom). A cover ring 186 rests on the top of the upwardly extending inner portion 188 of the bottom shield 174 when the substrate support pedestal 102 is in a lower, loading position but rests on the outer periphery of the substrate support pedestal 102 when the substrate support pedestal 102 is in an upper, deposition position to protect the substrate support pedestal 102 from sputter deposition. An additional deposition ring (not shown) may be used to shield the periphery of the substrate 104 from deposition.

In some embodiments, a magnet 190 may be disposed about the processing chamber 100 for selectively providing a magnetic field between the substrate support pedestal 102 and the target 106. For example, as shown in FIG. 1, the magnet 190 may be disposed about the outside of the chamber wall 108 in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

To facilitate control of the processing chamber 100, the processing chamber 100 includes a controller 121. The controller 121 includes a central processing unit (CPU) 123, which may be one of any form of general-purpose computer processor that can be used in an industrial setting, such as a programmable logic controller (PLC), for controlling various chambers and sub-processors. A memory 127 is coupled to the CPU 123, and the memory 127 can be a non-transitory computer readable storage medium and may be one or more of readily available memory such as random access memory (RAM), read only memory (ROM), floppy disk drive, hard disk, or any other form of digital storage, local or remote. Support circuits 129 (e.g., I/O circuits) including one or more of power supplies, clocks, cache, etc. are coupled to the CPU 123 for supporting the processor in a conventional manner. Charged species generation, heating, and other processes are generally stored in the memory 127, typically as software routine (e.g., a processing recipe). The software routine may also be stored and/or executed by a second CPU (not shown) that is remotely located from the processing chamber 100 being controlled by the CPU 123.

The memory 127 contains instructions that when executed by the CPU 123, facilitates the operation of the processing chamber 100. The instructions in the memory 127 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
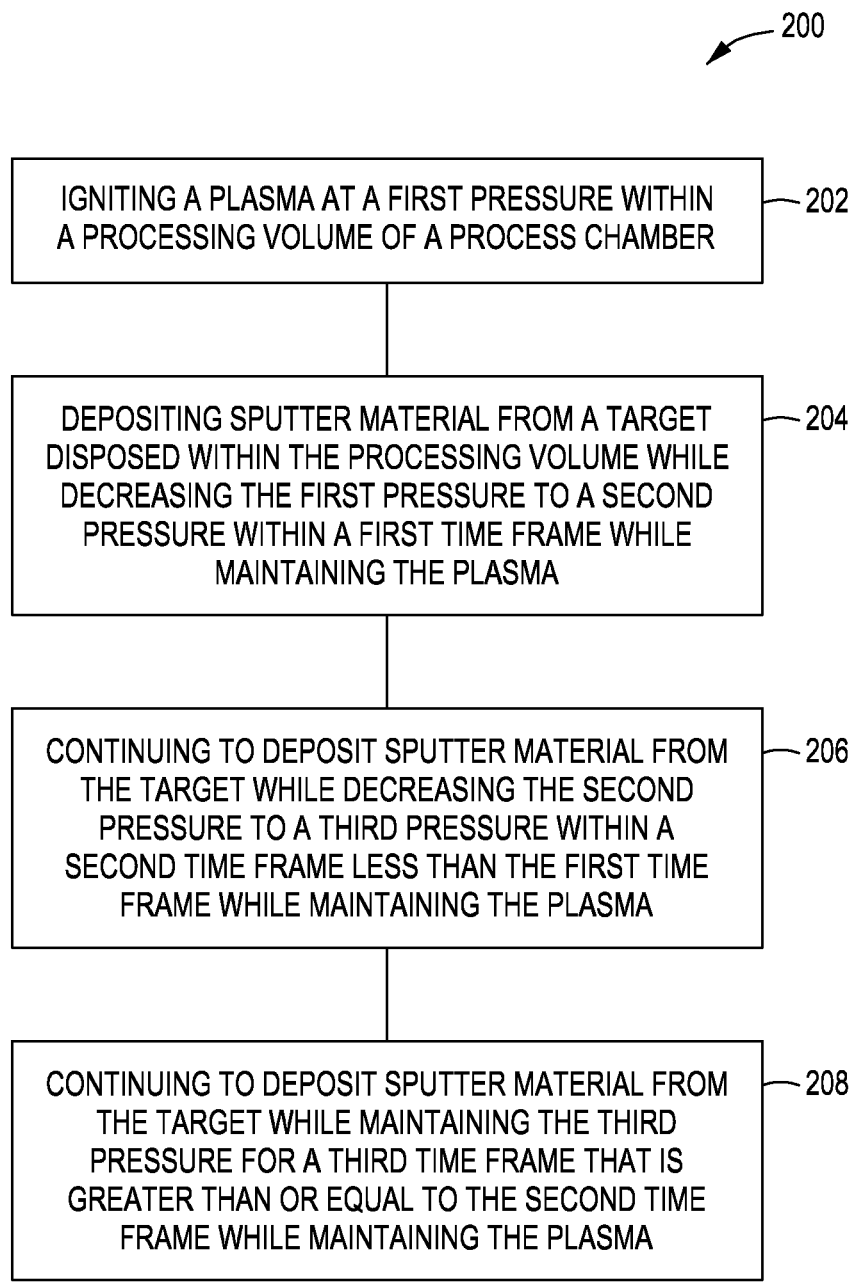
FIG. 2 is a flowchart of a method for processing a substrate in accordance with at least some embodiments of the present disclosure.

FIG. 2 is a flowchart of a method 200 for processing a substrate in accordance with at least some embodiments of the present disclosure. At 202, a plasma is ignited at a first pressure (e.g., ignition pressure) within a processing volume of a process chamber. For example, a first pressure can be maintained within a process volume (e.g., the process volume 148) of a processing chamber (e.g., the processing chamber 100, such as a PVD processing chamber) for igniting a process gas to form a plasma within the process volume. The pump 171 and the valve 160 can be used to maintain the first pressure within the process volume. As noted above, the process gas can be one or more noble gases such as Ar, He, Kr, Ne, Rn, or Xe, or can be one or more other non-reactive gases. For example, in at least some embodiments, the process gas can be Ar. The first pressure can be about 2 mTorr to about 40 mTorr. For example, in at least some embodiments, the first pressure can be about 0.005 Torr (e.g., about 5 mTorr). The first pressure can be maintained for a time period suitable for igniting the plasma. In at least some embodiments, at 202 the first pressure can be maintained for about one (1) second to about five (5) seconds.

Next, at 204, sputter material is deposited from a target disposed within the processing volume while decreasing the first pressure to a second pressure within a first time frame while maintaining the plasma. For example, the first pressure can be decreased to a second pressure (e.g., ramp down pressure) for depositing sputter material from a target (e.g., cobalt, copper, manganese, tantalum, titanium, tungsten) disposed within the process volume. For example, using the pump 171 and the valve 160, the pressure can be incrementally decreased from the first pressure to about 2 mTorr to about 0.1 mTorr (e.g., the second pressure). For example, in at least some embodiments, the pressure can be incrementally decreased in a step by step manner using, for example, the valve 160 from the first pressure to about 0.6 mTorr. In at least some embodiments, the first pressure can be decreased to the second pressure over a period having a duration of about one (1) to about ten (10) seconds (e.g., the first time frame).

During 204, depending on the target material, process gas, etc., the plasma may be maintained within the process volume with using process gas supplied from a gas source (e.g., the gas source 154). Alternatively, during 204, the plasma may be maintained within the process volume without using the process gas from the gas source (e.g., a self-ionized plasma (SIP) can be achieved within the processing chamber). For example, when enough ionization of sputtered material is present within the process volume, the gas source can be turned off and the plasma can be maintained using the ionized sputter material.

Next at 206, sputter material is continued to be deposited from the target while decreasing the second pressure to a third pressure within a second time frame, less than the first time frame, while maintaining the plasma. For example, in at least some embodiments, the pressure can be decreased from the second pressure to about 0.001 mTorr to about 2 mTorr (e.g., the third pressure).

During 206, the plasma may be maintained within the process volume without using the process gas from the gas source (e.g., a SIP can be achieved within the processing chamber). In at least some embodiments, the second time frame for decreasing the second pressure to the third pressure can be about three seconds to about six seconds. As noted above, in doing so in such a relatively short time, plasma can reach SIP mode, and metal ions will be dominant and be guided through the collimator 173, thus resulting in improved metal deposition coverage on a substrate.

Next, at 208 sputter material is continued to be deposited from the target while maintaining the third pressure for a third time frame, that is greater than or equal to the second time frame, while maintaining the plasma. For example, the third pressure is maintained at a stable pressure that is suitable for high DC SIP deposition. For example, the third pressure can be maintained at 0.001 mTorr to about 2 mTorr.

While the foregoing is directed to embodiments of the present disclosure, other and further embodiments of the disclosure may be devised without departing from the basic scope thereof.

The invention claimed is:

1. A method for processing a substrate, comprising:
igniting a plasma at a first pressure within a processing volume of a process chamber;
depositing sputter material from a target disposed within the processing volume while decreasing the first pressure to a second pressure within a first time frame while maintaining the plasma, wherein decreasing the first pressure to the second pressure comprises incrementally decreasing the first pressure to about 2 mTorr to about 0.1 mTorr;
continuing to deposit sputter material from the target while decreasing the second pressure to a third pressure within a second time frame different from the first time frame while maintaining the plasma, wherein decreasing the first pressure to the second pressure during the first time frame takes about one second to about ten seconds and decreasing the second pressure to the third pressure during the second time frame takes about three seconds to about six seconds; and continuing to deposit sputter material from the target while maintaining the third pressure for a third time frame that is greater than or equal to the second time frame while maintaining the plasma.

2. The method of claim 1, wherein decreasing the second pressure to the third pressure comprises decreasing the second pressure to about 0.001 mTorr to about 2 mTorr.

3. The method of claim 1, wherein the target is made from at least one of cobalt, copper, manganese, tantalum, titanium, tungsten, or alloys thereof.

4. The method of claim 1, wherein the plasma is formed using a noble gas.

5. The method of claim 1, wherein the processing chamber is a plasma chamber.

* * * * *